United States Patent
Brown et al.

(10) Patent No.: US 10,878,876 B2
(45) Date of Patent: *Dec. 29, 2020

(54) APPARATUSES AND METHODS FOR PROVIDING POWER FOR MEMORY REFRESH OPERATIONS

(71) Applicant: MICRON TECHNOLOGY, INC., Boise, ID (US)

(72) Inventors: Jason M. Brown, Allen, TX (US); Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/557,948

(22) Filed: Aug. 30, 2019

(65) Prior Publication Data

US 2020/0013448 A1    Jan. 9, 2020

Related U.S. Application Data

(63) Continuation of application No. 16/027,158, filed on Jul. 3, 2018, now Pat. No. 10,438,646.

(51) Int. Cl.
  *G11C 11/406*    (2006.01)
  *G11C 11/4076*   (2006.01)
  *G11C 11/4074*   (2006.01)

(52) U.S. Cl.
  CPC ........ *G11C 11/406* (2013.01); *G11C 11/4074* (2013.01); *G11C 11/4076* (2013.01)

(58) Field of Classification Search
  CPC .................................................. G11C 11/406
  See application file for complete search history.

(56) References Cited

U.S. PATENT DOCUMENTS

| 5,317,538 | A | 5/1994 | Eaton |
| 5,367,487 | A | 11/1994 | Yoshida |
| 5,761,112 | A | 6/1998 | Murray et al. |
| 6,166,977 | A | 12/2000 | Saitoh et al. |
| 10,438,646 | B1 * | 10/2019 | Brown .................. G11C 11/406 |
| 2001/0010457 | A1 | 8/2001 | Kobayashi et al. |
| 2001/0010459 | A1 | 8/2001 | Kobayashi et al. |

(Continued)

OTHER PUBLICATIONS

U.S. Appl. No. 16/027,158, titled "Apparatuses and Methods for Providing Power for Memory Refresh Operations", filed Jul. 3, 2018.

*Primary Examiner* — Jay W. Radke
(74) *Attorney, Agent, or Firm* — Dorsey & Whitney LLP

(57) ABSTRACT

Apparatuses and methods for providing power for memory refresh operations are described. An example apparatus includes refresh circuits, a power amplifier, a power circuit, and a power control circuits. The refresh circuits are configured to refresh memory cells of a memory bank. The power amplifier is configured to provide power when activated to the refresh circuits. The power provided by the power amplifier has a first voltage. The power circuit is configured to receive a power supply voltage and to provide power when activated to the refresh circuits. The power provided by the power amplifier has a second voltage. The power control circuit is configured to compare the first voltage and the target voltage and to provide an activation signal to control activation of the power circuit having an active duration based at least in part on the comparison.

18 Claims, 5 Drawing Sheets

(56) References Cited

U.S. PATENT DOCUMENTS

2007/0183236 A1 8/2007 Jeong
2012/0223684 A1 9/2012 Lim et al.
2015/0188313 A1 7/2015 Guo et al.

* cited by examiner

APPARATUSES AND METHODS FOR PROVIDING POWER FOR MEMORY REFRESH OPERATIONS

CROSS REFERENCE TO RELATED APPLICATION(S)

This application is a continuation of U.S. patent application Ser. No. 16/027,158, filed Jul. 3, 2018 and issued as U.S. Pat. No. 10,438,646 on Oct. 8, 2019. The aforementioned application and patent are incorporated herein by reference, in their entirety for any purpose.

BACKGROUND

Many battery-powered portable electronic devices, such as laptop computers, cell phones, tablets, and the like, require memory devices that provide large storage capacity and low power consumption. A large storage capacity is typically desired in these devices to maximize the amount of available storage. For this reasons, it is usually desirable to utilize dynamic random access memory (DRAM) because DRAM devices generally have a relatively large storage capacity over other types of memories.

DRAM devices have the disadvantage that their memory cells must be refreshed because of the means by which they store data. As is known in the art, DRAM memory cells each consists of a capacitor that is charged to one of two voltages to store a bit of data. Charge leaks from the capacitor by various means. It is for this reason that DRAM memory cells must be refreshed by recharging them to the original voltage. Refresh is typically performed by essentially reading data bits from the memory cells in each row of a memory cell array, and then restoring those same data bits back to the same cells in the row. Refresh is generally performed on a row-by-row basis at a rate needed to keep charge stored in the memory cells from leaking excessively between refreshes.

Refreshing DRAM memory cells tends to consume power at a substantial rate. For example, each time a row of memory cells is refreshed, a pair of digit lines for each memory cell is switched to complementary voltages and then equilibrated, which consumes a significant amount power. As the number of columns in the memory cell array increases with increasing memory capacity, the power consumed in actuating each row increases accordingly. Multiple power circuits may also be included in the DRAM devices in order to provide sufficient power to perform refresh operations, thereby multiplying the power consumption during refresh.

Therefore, reducing power consumption related to refreshing memory cells may be desirable.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring examples of the disclosure. Additionally, terms such as "couples" and "coupled" mean that two components may be directly or indirectly electrically coupled. Indirectly coupled may imply that two components are coupled through one or more intermediate components.

Figure 1:
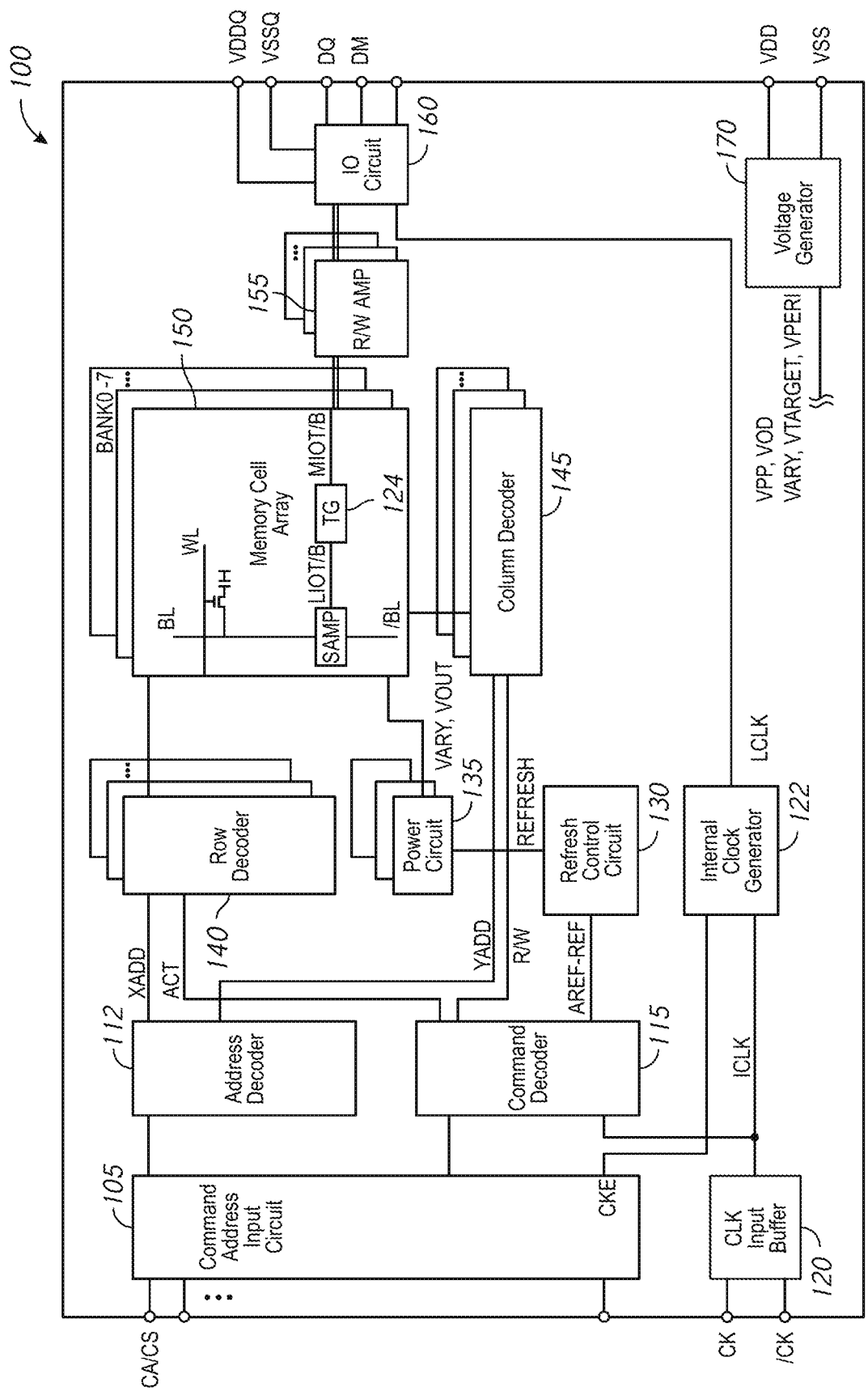
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred to as such. In some embodiments, the semiconductor device 100 may include, without limitation, a DRAM device, such as low power DDR (LPDDR) memory integrated into a single semiconductor chip, for example.

The semiconductor device 100 includes a memory array 150. The memory array 150 is shown as including a plurality of memory banks. In the embodiment of FIG. 1, the memory array 150 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 140 and the selection of the bit lines BL and /BL is performed by a column decoder 145. In the embodiment of FIG. 1, the row decoder 140 includes a respective row decoder for each memory bank and the column decoder 145 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 155 over complementary local data lines (LIOT/B), transfer gate (TG), and complementary main data lines (MIOT/B). Conversely, write data outputted from the read/write amplifiers 155 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address and chip select (CA/CS) terminals coupled to a command and address bus to receive commands and addresses, and a CS signal, clock terminals to receive clocks CK and /CK, data terminals DQ and DM, and power supply terminals to receive power supply potentials VDD, VSS, VDDQ, and VSSQ.

The CA/CS terminals may be supplied with memory addresses. The memory addresses supplied to the CA/CS terminals are transferred, via a command/address input circuit 105, to an address decoder 112. The address decoder 112 receives the address and supplies a decoded row address XADD to the row decoder 140 and supplies a decoded column address YADD to the column decoder 145. The CA/CS terminals may be supplied with commands. The commands may be provided as internal command signals to a command decoder 115 via the command/address input circuit 105. The command decoder 115 includes circuits to decode the internal command signals to generate various internal signals and commands for performing operations. For example, the command decoder 115 may provide a row command signal ACT to select a word line and a column command signal R/W to select a bit line. In another example, the command decoder 115 may provide a refresh command AREF-REF to a refresh control circuit 130 to perform a refresh operation on memory cells of the memory array 150.

When a read command is received, and a row address and a column address are timely supplied with the read command, read data is read from memory cells in the memory array 150 corresponding to the row address and column address. The read command is received by the command decoder 115, which provides internal commands so that read data from the memory array 150 is provided to the read/write amplifiers 155. The read data is output to outside from the data terminals DQ via the input/output circuit 160.

When the write command is received, and a row address and a column address are timely supplied with the write command, write data supplied to the data terminals DQ is written to a memory cells in the memory array 150 corresponding to the row address and column address. A data mask may be provided to the data terminals DM to mask portions of the data when written to memory. The write command is received by the command decoder 115, which provides internal commands so that the write data is received by data receivers in the input/output circuit 160, and supplied via the input/output circuit 160 to the read/write amplifiers 155. The write data is provided by the read/write amplifiers 155 to the memory array 150 to be written into the memory cell MC.

When a refresh command AREF-REF is received by the refresh control circuit 130, the refresh control circuit 130 provides a refresh activation signal REFRESH for controlling refresh operations. For example, the REFRESH signal is provided to power circuits 135 to control provision of power by the power circuits 135. The power circuits 135 provide power outputs having potentials VARY and VOUT to refresh circuits of the memory array 150 that are used for refreshing the memory cells of each of the memory banks of the memory array 150. The refresh circuits may include, for example, sense amplifiers SAMP.

The clock terminals CK and /CK are supplied with external clocks that are provided to an input buffer 120. The external clocks may be complementary. The input buffer 120 generates an internal clock ICLK based on the CK and /CK clocks. The ICLK clock is provided to the command decoder 115 and to an internal clock generator 122. The internal clock generator 122 provides various internal clocks LCLK based on the ICLK clock. The LCLK clocks may be used for timing operation of various internal circuits. For example, the clocks may be provided to the input/output circuit 160 for timing the operation of the input/output circuit 160 to provide and receive data on the data terminals DQ.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VTARGET, VPERI, and the like based on the power supply potentials VDD and VSS supplied to the power supply terminals. The internal potential VPP is mainly used in the row decoder 140, the internal potentials VOD and VARY are mainly used in the sense amplifiers SAMP included in the memory array 150, VTARGET may be a target voltage for the internal potential VARY, and the internal potential VPERI is used in many peripheral circuit blocks.

The power supply terminals are also supplied with power supply potentials VDDQ and VSSQ. The power supply potentials VDDQ and VSSQ are supplied to the input/output circuit 160. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 160 so that power supply noise generated by the input/output circuit 160 does not propagate to the other circuit blocks.

Figure 2:
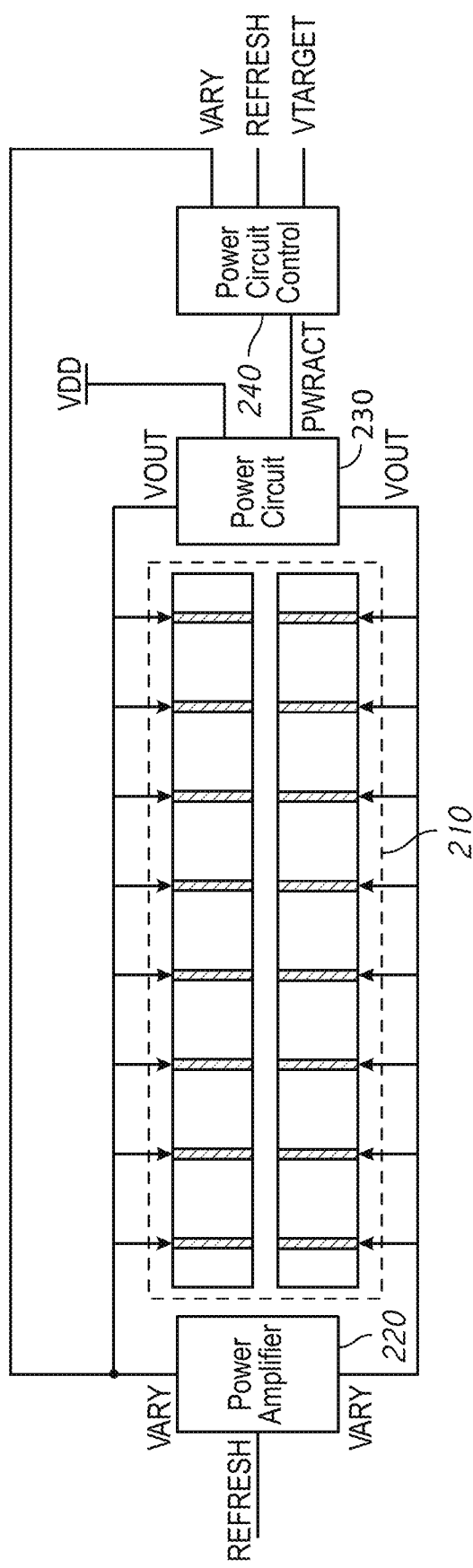
FIG. 2 is a block diagram of a memory bank and power circuits according to an embodiment of the disclosure.

FIG. 2 is a block diagram of a memory bank 210 and power circuits according to an embodiment of the disclosure. The memory bank 210 and power circuits of FIG. 2 may be included in the semiconductor device 100 of FIG. 1 in some embodiments of the disclosure, for example, in the memory array 150 and the power circuits 135.

The memory bank 210 includes memory cells that may be accessed to write data or to read data. The memory bank 210 further includes refresh circuits for refreshing the memory cells of the memory bank. The refresh circuits may include, for example, sense amplifiers that sense and amplify data stored in the memory cells, and in the process, refresh the data stored. Power for refreshing the memory cells is provided to the refresh circuits by a power amplifier 220 and a power circuit 230.

The power amplifier 220 is provided a refresh activation signal REFRESH to activate the power amplifier when the REFRESH signal is active (e.g., active high logic level). The REFRESH signal may be provided, for example, by a refresh control circuit (e.g., refresh control circuit 130 of FIG. 1) that provides internal control signals including a REFRESH signal to perform refresh operations. When activated for a refresh operation, the power amplifier 220 provides a power output to the refresh circuits for refreshing the memory cells. The power output may have a voltage VARY. The power amplifier 220 may be activated and deactivated multiple times during a refresh operation. For example, in some embodiments of the disclosure, the power amplifier 220 is activated and deactivated four times over a refresh cycle of a refresh operation. The power amplifier 220 may be activated and deactivated greater or fewer times in other embodiments of the disclosure. The power amplifier 220 may include a power amp having a configuration that is now known or later developed.

As previously described, power demand for a refresh operation may initially cause the power output of the power amplifier 220 to dip to less than a target VARY voltage. The power amplifier 220 may eventually recover and provide the power output with the target VARY voltage. However, recovery from the dip in power output voltage may result in significant power consumption by the power amplifier 220. Additionally, in order to prevent any failures and /or operational delays due to the power output voltage dip, multiple power amplifiers are often included for each of the memory banks and are concurrently activated, which further increases power consumption.

The power circuit 230 provides supplemental power having a VOUT voltage to assist in powering circuits of the memory bank 210 during operation, for example, during refresh operations. The power circuit 230 receives power from a power supply. The power provided by the power circuit 230 may be based on a power supply voltage, for example, VDD, that is provided to the power circuit 230. In some embodiments of the disclosure, the VDD voltage is greater than the VARY voltage. As previously described, the power supply voltage VDD may be a voltage externally provided to an external power terminal. In the context of a refresh operation, the power circuit 230 may be activated during the refresh operation to provide a voltage VOUT to assist in powering the refresh circuits of the memory bank 210. For example, activation of the power circuit 230 during the refresh operation, such as for a portion of when the power amplifier 220 is activated, may assist in powering refresh circuits while there is a dip in power output voltage from the target VARY voltage. Providing the voltage VOUT based on the power supply voltage VDD may reduce power consumption by the power amplifier 220. The voltage VOUT provided by the activated power circuit 230 may also accelerate recovery of the power output of the power amplifier 220 to the target VARY voltage. The power circuit 230 may, in some situations, allow configurations having fewer power amplifiers 220 to power refresh circuits in comparison with conventional designs.

A power control circuit 240 provides a control signal PWRACT to the power circuit 230. The power control circuit 240 controls activation and deactivation of the power circuit 230 using the PWRACT signal. For example, a high logic level PWRACT signal may activate the power circuit 230 to provide power having the VOUT voltage and a low logic level PWRACT signal may deactivate the power circuit 230. During a refresh operation, the power control circuit 240 provides the PWRACT signal having a logic level based on the output of the power amplifier 220, shown in FIG. 2 as VARY, and a target voltage VTARGET. The VTARGET voltage in some embodiments of the disclosure may be equal to the target VARY voltage. The VTARGET voltage may be greater or less than the target VARY voltage in other embodiments of the disclosure. The VTARGET voltage may be provided by a reference voltage circuit (not shown). The reference voltage circuit may have a design now known or later developed.

Responsive to the REFRESH signal (e.g., active high logic level), the power control circuit 240 compares the VARY voltage of the power output provided by the power amplifier 220 to the VTARGET voltage. Based on the comparison, the power control circuit 240 controls activation of the power circuit 230 with the PWRACT signal to provide the VOUT voltage to assist in powering the refresh circuits of the memory bank 210. In some embodiments of the disclosure, the power control circuit 240 controls a timing of the activation of the power circuit 230 based on the comparison of the VARY and VTARGET voltages. For example, the power control circuit 240 may control when the power circuit 230 is activated to provide the VOUT voltage and /or control for how long the power circuit 230 is activated to provide the VOUT voltage. During activation, the power circuit 230 provides the VOUT voltage to refresh circuits of the memory bank 210.

Figure 3:
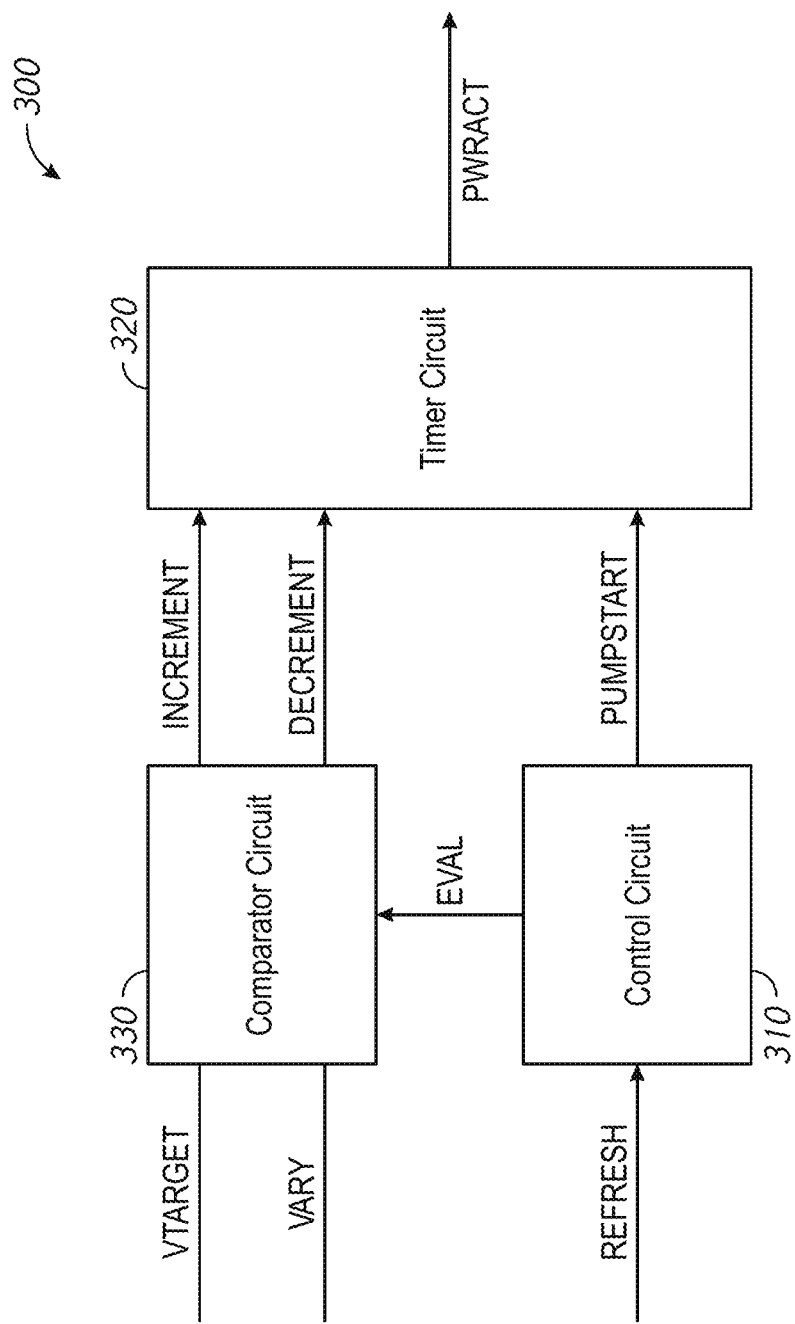
FIG. 3 is a block diagram of a power control circuit according to an embodiment of the disclosure.

FIG. 3 is a block diagram of a power control circuit 300 according to an embodiment of the disclosure. The power control circuit 300 may be included in the power control circuit 240 of FIG. 2, in some embodiments of the disclosure.

The power control circuit 300 includes a control circuit 310 that receives a refresh activation signal REFRESH. In some embodiments of the disclosure, an active REFRESH signal indicates when a power amplifier (e.g., power amplifier 220 of FIG. 2) is activated during a refresh operation to provide power to refresh circuits of a memory bank for refreshing memory cells. As previously described, the power amplifier may be activated and deactivated multiple times during a refresh operation. The REFRESH signal may be related to other indicators that a refresh operation is performed, for example, an internal refresh command AREF-REF.

The control circuit 310 provides a power circuit activation signal PUMPSTART to a timer circuit 320 based on the REFRESH signal and further provides a comparison activation signal EVAL to a comparator circuit 330 based on the REFRESH signal. When activated by the EVAL signal, the comparator circuit 330 compares a voltage VARY with a target voltage VTARGET and provides control signals INCREMENT and DECREMENT to the timer circuit 320. In some embodiments of the disclosure, the EVAL signal may activate the comparator circuit 330 when the REFRESH signal becomes inactive. The INCREMENT and DECREMENT signals may be based on the comparison between the VARY voltage and the VTARGET voltage. For example, the comparator circuit 330 may provide and active INCREMENT signal (e.g., active high logic level pulse) when the VARY voltage is less than the VTARGET voltage. Conversely, the comparator circuit 330 may provide an active DECREMENT signal when the VARY voltage is greater than the VTARGET voltage.

The VARY voltage may be a voltage of a power output from a power amplifier, such as power amplifier 220 of FIG. 2, in some embodiments of the disclosure. The VTARGET voltage may be equal to a target VARY voltage in some embodiments of the disclosure. In other embodiments of the disclosure, the VTARGET voltage is greater than or less than the target VARY voltage.

The timer circuit 320 provides a control signal PWRACT based on the INCREMENT and DECREMENT signals from the comparator circuit 330 and an active PUMPSTART signal from the control circuit 310. The PUMPSTART signal may be active responsive to activation of the REFRESH signal in some embodiments of the disclosure. The PWRACT signal may be used to control activation and deactivation of a power circuit, such as power circuit 230 of FIG. 2, in some embodiments of the disclosure. As previously described, the power circuit may provide power to assist in powering refresh circuits of a memory bank. The timer circuit 320 provides the PWRACT signal having a timing and /or duration, for example, to control timing of power circuit activation. For example, a duration of the active PWRACT signal (e.g., active high logic level) may control an activation duration of a power circuit. For example, a longer active PWRACT signal may control the power circuit to provide power for a greater time. The duration of the active PWRACT signal may be changed based on the INCREMENT and /or DECREMENT signals. For example, an active INCREMENT signal from the comparator circuit 330 may cause the timer circuit 320 to increase an active duration of the PWRACT signal, whereas an active DECREMENT signal from the comparator circuit 330 may cause the timer circuit 320 to decrease an active duration of the PWRACT signal. As to a timing of the active PWRACT signal, when an active PUMPSTART signal is received from the control circuit 310, the timer circuit 320 may provide an active PWRACT signal having a timing based on the active PUMPSTART signal. In some embodiments of the disclosure, the timer circuit 320 provides an active PWRACT signal with a delay relative to the active PUMPSTART signal. The delay may be a fixed delay in some embodiments of the disclosure. In other embodiments of the disclosure, the delay may be variable, for example, based on the INCREMENT and /or DECREMENT signals, and /or other signals indicative of a condition of the refresh operation.

Figure 4:
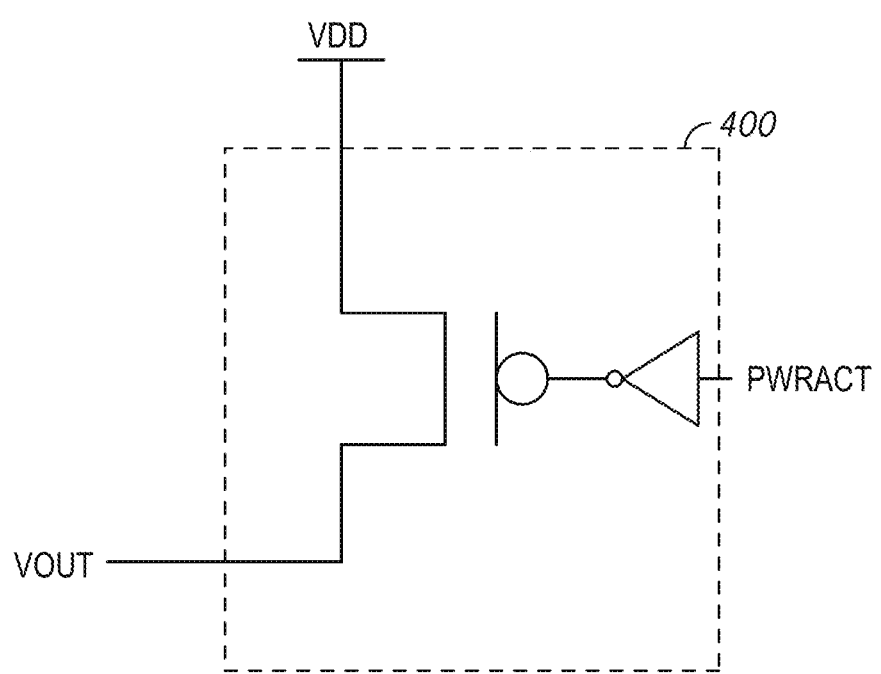
FIG. 4 is a schematic diagram of a power circuit according to an embodiment of the disclosure.

FIG. 4 is a schematic diagram of a power circuit 400 according to an embodiment of the disclosure. The power circuit 400 may be included in the power circuit 230 of FIG. 2 in some embodiments of the disclosure.

The power circuit 400 includes a p-type transistor that is coupled to a power supply VDD and is controlled by a control signal PWRACT. When activated by an active PWRACT signal (e.g., active high logic level), the power circuit 400 provides the VDD voltage as a VOUT voltage. For example, the power circuit 400 is activated to provide the VDD voltage as the VOUT voltage when the PWRACT signal is an active high logic level. Conversely, the power circuit 400 is deactivated when the PWRACT signal is an inactive low logic level. In this manner, the power circuit 400 can be controlled by the PWRACT signal to provide the VOUT voltage, for example, to assist in powering refresh circuits of a memory bank during refresh operations.

Figure 5:
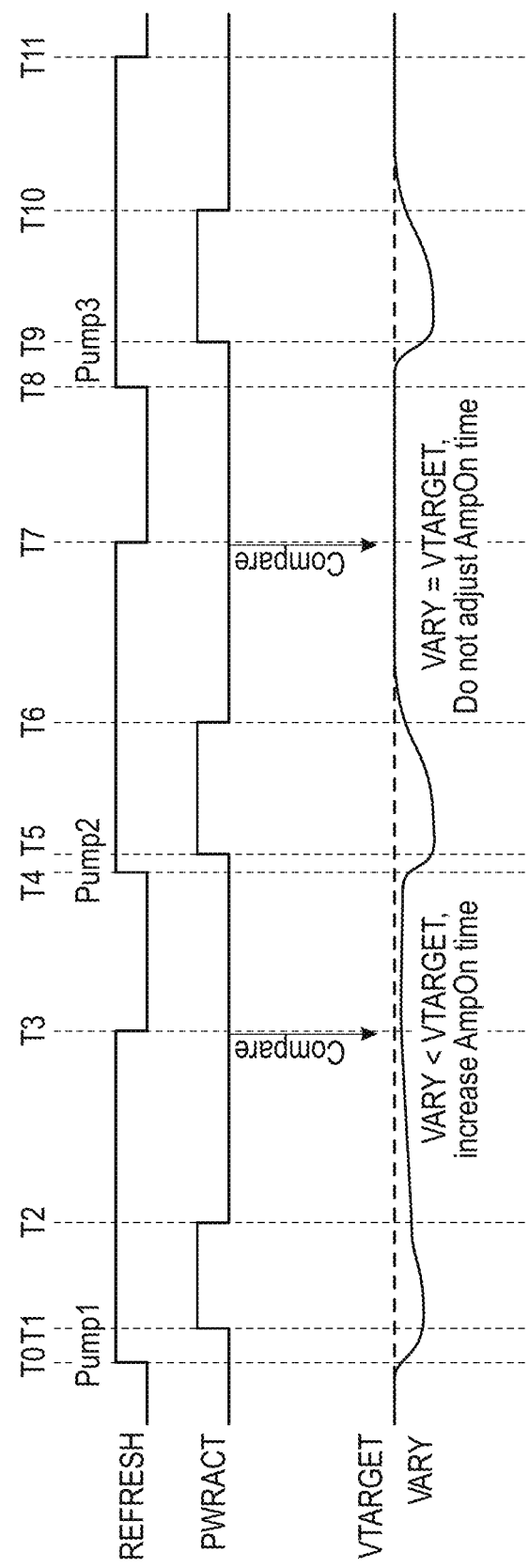
FIG. 5 is a signal diagram of various signals during operation of power circuits for powering refresh circuits during refresh operations according to an embodiment of the disclosure.

FIG. 5 is a signal diagram of various signals during operation of power circuits for powering refresh circuits during refresh operations according to an embodiment of the disclosure. In some embodiments of the disclosure, the operation shown by the signal diagram of FIG. 5 may be used with the power circuits previously described with reference to FIG. 2.

The signal diagram of FIG. 5 includes a refresh activation signal REFRESH, a control signal PWRACT, a target voltage VTARGET, and voltage VARY of a power output provided by a power amplifier. In the example operation of FIG. 5, the VTARGET voltage represents a target VARY voltage for the power output from the power amplifier. In an embodiment of the disclosure where the signal diagram of FIG. 5 is applied to the power circuits described with reference to FIG. 2, the power amplifier 220 provides a power output having the VARY voltage, and the VARY voltage, VTARGET voltage, and REFRESH signal are provided to the power control circuit 240. In such embodiments of the disclosure, the power control circuit 240 provides the PWRACT signal to control activation and deactivation of the power circuit 230, which may be used to assist in powering refresh circuits of the memory bank 210.

The signal diagram of FIG. 5 will be described for an example operation with reference to the power circuits of FIG. 2 and the power control circuit 300 of FIG. 3.

At time T0, the REFRESH signal becomes active, which activates the power amplifier 220 to provide a power output having a voltage of VARY to refresh circuits for a refresh operation. As shown in FIG. 5, the voltage VARY of the power output from the power amplifier 220 dips from the target voltage VTARGET due to the power demand of the refresh circuits.

At time T1 the PWRACT signal becomes active to activate the power circuits 230 to provide a voltage VOUT to assist in powering the refresh circuits. As previously described, the VOUT voltage provided by the power circuit 230 may be based on a power supply voltage VDD. The VDD voltage may be an externally provided voltage applied to an external power terminal in some embodiments of the disclosure. With the power circuit 230 activated, the VOUT voltage may assist in powering refresh circuits and in recovering from the dip in power output voltage from the target voltage VTARGET. As shown in the signal diagram of FIG. 5, activation of the power circuit 230 and provision of the VOUT voltage may assist in the power output voltage VARY to recovering toward the VTARGET voltage.

At time T2 the PWRACT signal becomes inactive to deactivate the power circuit 230 to no longer provide the VOUT voltage to assist in powering refresh circuits of the memory bank. At time T3, the REFRESH signal becomes inactive to deactivate the power amplifier 220 to no longer provide a power output to the refresh circuits. Also at time T3 the VTARGET voltage and the VARY voltage are compared, for example, by the comparator circuit 330 included in the power circuit control 300 of FIG. 3. As shown in the signal diagram of FIG. 5, the voltage VARY of the power output provided by the power amplifier 210 does not recover to the VTARGET voltage by when the power amplifier 210 is deactivated. With the VARY voltage being less than the VTARGET voltage, an activation duration of the power circuit 230 may be changed to provide the VOUT voltage for longer. For example, following comparison of the VARY and VTARGET voltages, the comparator circuit 330 may provide an active control signal INCREMENT to increase a time for activation of the power circuit 230. Based on the active INCREMENT signal, the timer circuit 320 is controlled to increase an active time for the PWRACT signal to increase the duration of the time the power circuit 230 is activated to provide the VOUT voltage to assist in powering refresh circuits.

At time T4, the REFRESH signal becomes active again to activate the power amplifier 220 to provide the power output having the VARY voltage to power the refresh circuits for a refresh operation. As shown in FIG. 5, the voltage of the power output from the power amplifier 220 dips from the target voltage VTARGET due to the power demand of the refresh circuits.

At time T5 the PWRACT signal becomes active again to activate the power circuit 230 to provide a voltage VOUT to assist in powering the refresh circuits. With the power circuit 230 activated, the VOUT voltage may assist in powering refresh circuits and in recovering from the dip in power output voltage VARY from the target voltage VTARGET.

At time 16 the PWRACT signal becomes inactive to deactivate the power circuit 230 to no longer provide the VOUT voltage. As previously described, the activation time of the PWRACT signal was increased following the comparison of the VARY and VTARGET voltages at time T3 by providing an active INCREMENT signal in order to activate the power circuit 230 longer than the previous activation between times T1 and T2. As a result, the activation time for the second activation of the power circuit 230 between times T5 and T6 is greater than the activation time between times T1 and T2.

At time T7, the REFRESH signal becomes inactive to deactivate the power amplifier 210 to no longer provide a power output to the refresh circuits. Also at time T7 the VTARGET voltage and the VARY voltage are compared. As shown in the signal diagram of FIG. 5, in contrast to the VARY voltage at time T3, the voltage VARY of the power output provided by the power amplifier 210 recovers to the VTARGET voltage by when the power amplifier 230 is deactivated and the VARY voltage and the VTARGET voltage are compared at time T7. The longer activation time of the power circuit 230 between times T5 and T6 provides power for additional time to sufficiently assist the VARY voltage recover to the VTARGET voltage. With the VARY voltage recovering to the VTARGET voltage by the time the voltages are compared at time T7, the comparator circuit 330 of the power circuit control 300 does not provide an active INCREMENT or DECREMENT, thus leaving the duration of the activation time for the power circuit 230 unchanged.

The activation/deactivation of the power amplifier 210 at times T8 and T11, and the activation/deactivation of the power circuit 230 between times T9 and T10 are similar to the activation/deactivation of the power amplifier 210 at times T4 and T7 and the activation/deactivation of the power circuit 230 between times T5 and T6. As previously described, the VARY voltage and VTARGET voltage comparison at time T7 did not result in any change in the duration of the activation time for the power circuit 230. As a result, the activation time of the power circuit 230 between times T9 and T10 is the same as the activation time of the power circuit 230 between times T5 and T6, and the VOUT voltage provided by the activated power circuit 230 is sufficient to assist the VARY voltage to recover to the VTARGET voltage.

As shown in the signal diagram of FIG. 5, the activation time of the power circuit 230 may be changed based on the comparison of the VARY voltage and the VTARGET voltage. In the example of FIG. 5, the activation time of the power circuit is increased due to the VARY voltage not recovering to the VTARGET voltage by the comparison. Although not described, in contrast to the specific example previously described, the activation time of the power circuit may be decreased when the VARY voltage exceeds the VTARGET voltage at the time of the comparison. In this manner, the decreased activation time for the power circuit would bring the VARY voltage closer to the desired VTARGET voltage. The duration of the activation time for the power circuit may be adjusted to maintain VARY voltage recovery to the VTARGET voltage. In some embodiments of the disclosure, the VARY and VTARGET voltages are compared and the power circuit activation time may be adjusted each time the power amplifier 210 is deactivated (e.g., the REFRESH signal transitions from active to inactive). In other embodiments of the disclosure, the VARY voltage and the VTARGET voltage are compared and the power circuit activation time changed after a number of activations and deactivations of the power amplifier 210. The frequency and timing of voltage comparison and activation time adjustment may vary without departing from the scope of the disclosure.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
 refresh circuits configured to refresh memory cells of a memory bank;
 a power amplifier configured to provide power when activated to the refresh circuits, the power provided by the power amplifier having a first voltage;
 a power circuit configured to receive a power supply voltage and further configured to provide power when activated to the refresh circuits, the power provided by the power circuit having a second voltage; and
 a power control circuit configured to receive a target voltage, the first voltage, and a refresh activation signal, the power control circuit configured to compare the first voltage and the target voltage and further configured to provide an activation signal to control activation of the power circuit having an active duration based at least in part on the comparison, wherein the power control circuit is configured to increase active duration of the activation signal responsive to the first voltage being less than the target voltage and to decrease activate duration of the activation signal responsive to the first voltage being greater than the target voltage.

2. The apparatus of claim 1, wherein the power provided by the power amplifier is based on the power supply voltage.

3. The apparatus of claim 1, wherein the target voltage is equal to a target first voltage for the power amplifier.

4. The apparatus of claim 1, wherein the power circuit comprises:
 a p-type transistor; and
 an inverter configured to receive the activation signal from the power control circuit.

5. The apparatus of claim 1, wherein the power control circuit is configured to provide the activation signal to activate the power circuit after the power amplifier is activated and to deactivate the power circuit before the power amplifier is deactivated.

6. The apparatus of claim 1, wherein the power control circuit comprises a comparator circuit configured to compare the target voltage with the first voltage to determine the active duration of the power circuit.

7. An apparatus, comprising:
 a memory bank including memory cells and refresh circuits configured to refresh the memory cells;
 a first power circuit configured to provide first power to the refresh circuits during refresh operations;
 a second power circuit configured to receive power from a power supply, and when activated, provide second power to the refresh circuits that is based on the power from the power supply; and
 a control circuit configured to activate the second power circuit and control the duration the second power circuit is activated, wherein the control circuit is configured to maintain the duration the second power circuit is activated responsive to a voltage of the first power being equal to a target voltage at a comparison.

8. The apparatus of claim 7, wherein the second power circuit comprises a transistor configured to be coupled to the power supply.

9. The apparatus of claim 7, wherein the duration the second power circuit is activated is based on a voltage of the first power and the target voltage.

10. The apparatus of claim 7, wherein the control circuit is configured to increase a duration the second power circuit is activated responsive to the voltage of the first power being less than the target voltage at the comparison and to decrease duration the second power circuit is activated responsive to the voltage of the first power being greater than the target voltage at the comparison.

11. The apparatus of claim 7, wherein the second power circuit is configured to be coupled to a power supply and configured to couple the refresh circuits to the power supply when activated by the control circuit.

12. The apparatus of claim 7, wherein the second power circuit comprises a transistor configured to be activated by the control circuit.

13. The apparatus of claim 7, wherein the control circuit is configured to activate the second power circuit for a portion of when the first power circuit provides first power to the refresh circuits.

14. A method, comprising:
 providing power to refresh circuits during refresh operation; and supplementing the power provided to the refresh circuits with power from an external power supply voltage, for an activation duration having a time that is based on a comparison of a voltage of the power provided to the refresh circuits and a target voltage;

increasing the time of the active duration for supplemental provision of the power responsive to the voltage of the power being less than the target voltage at the comparison; and decreasing the time of the active duration for supplemental provision of the power responsive to the voltage of the power being less than the target voltage at the comparison.

15. The method of claim 14, further comprising coupling the refresh circuits to the external power supply to supplement provision of the power to the refresh circuits comprises.

16. The method of claim 14, further comprising:
providing the power to the refresh circuits for a plurality of periods of time during the refresh operation; and
comparing the voltage of the power provided to the refresh circuits and the target voltage at an end of the period of time for at least one of the plurality of periods of time.

17. The method of claim 14, further comprising adjusting the activation duration via adjustment of a timer circuit.

18. The method of claim 14, further comprising maintaining the time of the active duration for supplemental provision of the power responsive to the voltage of the power being equal to the target voltage at the comparison.

* * * * *